United States Patent
Wang

(10) Patent No.: US 10,418,276 B2
(45) Date of Patent: Sep. 17, 2019

(54) CONTROL METHOD FOR DIFFERENTIATED ETCHING DEPTH

(71) Applicant: Wuhan China Star Optoelectronics Technology Co., Ltd., Wuhan, Hubei (CN)

(72) Inventor: Wei Wang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 190 days.

(21) Appl. No.: 15/536,177

(22) PCT Filed: Apr. 25, 2017

(86) PCT No.: PCT/CN2017/081775
§ 371 (c)(1),
(2) Date: Jun. 15, 2017

(87) PCT Pub. No.: WO2018/176538
PCT Pub. Date: Oct. 4, 2018

(65) Prior Publication Data
US 2019/0088536 A1  Mar. 21, 2019

(51) Int. Cl.
*H01L 21/768* (2006.01)
*H01L 21/311* (2006.01)
(Continued)

(52) U.S. Cl.
CPC .... *H01L 21/76816* (2013.01); *H01L 21/3065* (2013.01); *H01L 21/30608* (2013.01); *H01L 21/31111* (2013.01); *H01L 21/31116* (2013.01); *H01L 21/31144* (2013.01); *H01L 21/32134* (2013.01); *H01L 21/32135* (2013.01); *H01L 21/84* (2013.01); *H01L 27/1218* (2013.01);
(Continued)

(58) Field of Classification Search
CPC ......... H01L 21/76816; H01L 21/31111; H01L 21/32134; H01L 27/1255; H01L 27/1262
USPC ................ 438/704, 737, 738, 740
See application file for complete search history.

(56) References Cited

U.S. PATENT DOCUMENTS

2003/0119225 A1    6/2003   Lee et al.
2004/0241984 A1   12/2004   Schwan et al.
(Continued)

FOREIGN PATENT DOCUMENTS

CN    102683273 A    9/2012
CN    103474391 A   12/2013

*Primary Examiner* — Binh X Tran
(74) *Attorney, Agent, or Firm* — Andrew C. Cheng

(57) ABSTRACT

A control method for differentiated etching depth is provided. The method includes: providing a first etching stop pattern layer in a panel having stacked structure; adopting a first etchant to perform a first etching process to the panel such that a location of the panel provided with the first etching stop pattern layer forms a first etching depth, and forms a second etching depth at a location of the panel without providing the first etching stop pattern layer; through controlling an etching time, the second etching depth is deeper than a bottom of the first etching stop pattern layer; and adopting a second etchant to perform a second etching process to the panel in order to etch and remove the first etching stop pattern layer. In a same mask process, through changing the etchant, different depths are etched and formed to reduce the time consuming and decrease the production cost.

10 Claims, 3 Drawing Sheets

(51) Int. Cl.
    *H01L 27/12*     (2006.01)
    *H01L 21/3213*     (2006.01)
    *H01L 21/84*     (2006.01)
    *H01L 21/306*     (2006.01)
    *H01L 21/3065*     (2006.01)
    *H01L 21/77*     (2017.01)

(52) U.S. Cl.
    CPC ...... *H01L 27/1288* (2013.01); *H01L 27/1255* (2013.01); *H01L 2021/775* (2013.01); *H01L 2221/101* (2013.01)

(56) References Cited

U.S. PATENT DOCUMENTS

| | | | |
|---|---|---|---|
| 2009/0159910 A1* | 6/2009 | Lin | H01L 33/22 257/98 |
| 2011/0147860 A1* | 6/2011 | Robert | G01P 15/0802 257/415 |
| 2011/0312152 A1* | 12/2011 | Kim | H01L 21/31116 438/397 |
| 2013/0023118 A1 | 1/2013 | Yeon et al. | |

* cited by examiner

CONTROL METHOD FOR DIFFERENTIATED ETCHING DEPTH

BACKGROUND OF THE INVENTION

1. Field of the Invention

The present invention relates to a display technology field, and more particularly to a control method for differentiated etching depth.

2. Description of Related Art

In the manufacturing process, etching is an art normally used. Generally, in order to reach the purpose of electric contact and bending a panel, dry etching or wet etching is usually adopted in order to etch through holes having different depths.

In the conventional art, for the through holes having different depths, several masks are adopted to achieve the above purpose. Therefore, the manufacturing time is longer, and the manufacturing cost is increased.

SUMMARY OF THE INVENTION

The present invention mainly provides a control method for differentiated etching depth in order to solve the problem that adopting several masks for through holes having different depths so that the manufacturing time is long.

In order to solve the above problem, a technology solution adopted by the present invention is: a control method for differentiated etching depth, comprising step of: providing a first etching stop pattern layer in a panel having stacked structure, and a second etching stop pattern layer in the panel having stacked structure, wherein, the second etching stop pattern layer is located below the first etching stop pattern layer; adopting a first etchant to perform a first etching process to the panel such that a location of the panel provided with the first etching stop pattern layer forms a first etching depth, and forms a second etching depth at a location of the panel without providing the first etching stop pattern layer; through controlling an etching time, the second etching depth is deeper than a bottom of the first etching stop pattern layer; adopting a second etchant to perform a second etching process to the panel in order to etch and remove the first etching stop pattern layer; adopting the first etchant to perform a third etching process to the panel such that a location of the panel provided with the second etching stop pattern layer and a location of the panel without providing the second etching stop pattern player are etched synchronously until an etching depth at the location without providing the second etching stop pattern layer is deeper than a bottom of the second etching stop pattern layer; adopting the second etchant to perform a fourth etching process to the panel in order to etch and remove the second etching stop pattern layer; adopting the first etchant to perform a fifth etching process to the panel; wherein, from a bottom to a top, the stacked structure includes a substrate, a barrier layer, a buffering layer, an active layer, a gate insulation layer covering the active layer, a gate pattern layer, a capacitor dielectric pattern layer covering the gate pattern layer, a capacitor electrode pattern layer and an insulation layer covering the capacitor electrode pattern layer; the first etching stop pattern layer and the capacitor electrode pattern layer adopt a same photolithography process to form and patterning simultaneously; and the second etching stop pattern layer and the gate pattern layer are disposed at a same layer and disposed on a surface of the gate insulation layer, and the second etching stop pattern layer and the gate pattern layer adopt a same photolithography process to form and patterning simultaneously.

In order to solve the above technology problem, another technology solution adopted by the present invention is: a control method for differentiated etching depth, comprising step of: providing a first etching stop pattern layer in a panel having stacked structure; adopting a first etchant to perform a first etching process to the panel such that a location of the panel provided with the first etching stop pattern layer forms a first etching depth, and forms a second etching depth at a location of the panel without providing the first etching stop pattern layer; through controlling an etching time, the second etching depth is deeper than a bottom of the first etching stop pattern layer; and adopting a second etchant to perform a second etching process to the panel in order to etch and remove the first etching stop pattern layer.

The beneficial effects of the resent invention are: comparing with the conventional art: the present invention through providing a first etching stop pattern layer in a panel having stacked structure; adopting a first etchant to perform a first etching process to the panel such that a location of the panel provided with the first etching stop pattern layer forms a first etching depth, and forms a second etching depth at a location of the panel without providing the first etching stop pattern layer; through controlling an etching time, the second etching depth is deeper than a bottom of the first etching stop pattern layer; and adopting a second etchant to perform a second etching process to the panel in order to etch and remove the first etching stop pattern layer, such that the location without providing the first etching stop pattern layer and the location providing with the first etching stop pattern layer form differentiated etching depth so that in a same mask process, through changing the etchant, different depths are etched and formed in order to reduce the time consuming of the process and decrease the production cost.

DETAILED DESCRIPTION OF THE PREFERRED EMBODIMENT

For letting the skilled person in this field to understand the technology solution of the present invention better, the following combines with figures and specific embodiments for describing the control method for differentiated etching depth provided by the present invention in detail.

Figure 1:
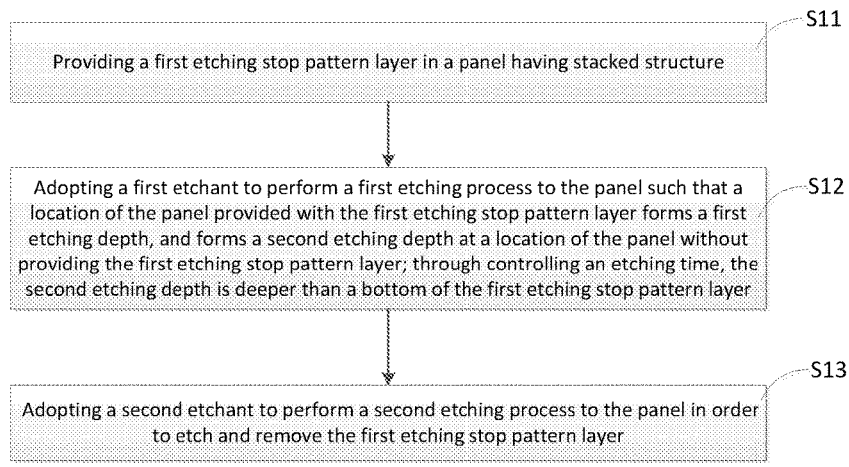
FIG. 1 is a flow chart of a control method for differentiated etching depth according to a first embodiment of the present invention.
Figure 2:
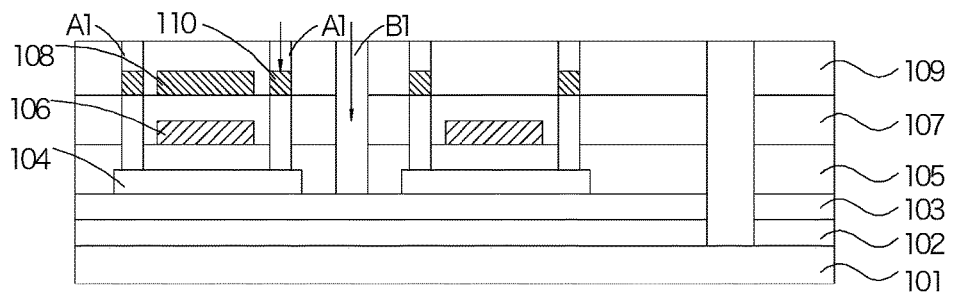
FIG. 2 is a schematic diagram of the status of the stacked structure in the step S12 shown in FIG. 1.

With reference to FIG. 1 and FIG. 2, the first embodiment of the control method for differentiated etching depth provided by the present invention includes:

S11: providing a first etching stop pattern layer 110 in a panel having stacked structure;

for illustrating conveniently, in the present embodiment, the stacked structure adopts a stacked structure in a flexible display panel as an example. That is, from a bottom to a top, the stacked structure includes a substrate 101, a barrier layer 102, a buffering layer 103, an active layer 104, a gate insulation layer 105 covering the active layer 104, a gate pattern layer 106, a capacitor dielectric pattern layer 107 covering the gate pattern layer 106, a capacitor electrode pattern layer 108 and an insulation layer 109 covering the capacitor electrode pattern layer 108.

Generally, in the stacked structure of the flexible display panel, holes to be etched with different depths are required. For example, as a hole to be etched A1 and a hole to be etched B1 shown in FIG. 1. The hole to be etched A1 is used for realizing a contact between a data line and the active layer 104 so that the hole to be etched A1 is required to be etched at an upper surface of the active layer 104. The hole to be etched B1 is used for decreasing a stress when the panel is bending so that the hole to be etched B1 is required to be etched to an upper surface of the buffering layer 103. Accordingly, in the present embodiment, an etching depth of the hole to be etched A1 is less than an etching depth of the hole to be etched B1.

Furthermore, at the hole to be etched A1, a first etching stop pattern layer 110 is provided.

Selectively, at the hole to be etched A1, forming the first etching stop pattern layer 110 arranged at a same layer with the capacitor electrode pattern layer 108 on the upper surface of the capacitor dielectric layer 107. Besides, for simplifying the process, when forming the capacitor electrode pattern layer 108, simultaneously adopting a same photolithography process to form the first etching stop pattern layer 110.

Wherein, a material of the stacked structure is an inorganic material such as $SiN_x$ or $SiO_2$. A material of the first etching stop pattern layer 108 is a metal material such as Mo, Ti, Al or an alloy of Ti and Al.

S12: adopting a first etchant to perform a first etching process to the panel such that a location of the panel provided with the first etching stop pattern layer 110 forms a first etching depth, and forms a second etching depth at a location of the panel without providing the first etching stop pattern layer 110. Through controlling an etching time, the second etching depth is deeper than a bottom of the first etching stop pattern layer 110.

Specifically, using a first etchant to perform a first etching process to the panel. The hole to be etched A1 and the hole to be etched B1 will be etched simultaneously, as the arrows shown in FIG. 2. When etching to an upper surface of the first etching stop pattern layer 110 at the location of the hole to be etched A1, because the etchant cannot etch the first etching stop pattern layer 110, the etching will be stopped in order to form a first etching depth. At the hole to be etched B1, because no etching stop pattern layer 110 is provided, the etching will be continued. At this time, through controlling the etching time, the hole to be etched B1 is etched to be over than a bottom surface of the first etching stop pattern layer 110 in order to form a second etching depth. In the present embodiment, through controlling the etching time, a depth that is over than a bottom surface of the first etching stop pattern layer 110 is equal to a thickness of the active layer 104.

Wherein, when adopting a dry etching method, the first etchant can include but not limited to a mixing gas of $CF_4$ and $O_2$ or a mixing gas of $C_2FH_5$, Ar and $H_2$. When a wet etching method is adopted, the first etchant can include but not limited to a liquid of HF or a liquid of BOE (buffer oxide etch).

S13: adopting a second etchant to perform a second etching process to the panel in order to etch and remove the first etching stop pattern layer 110.

Figure 3:
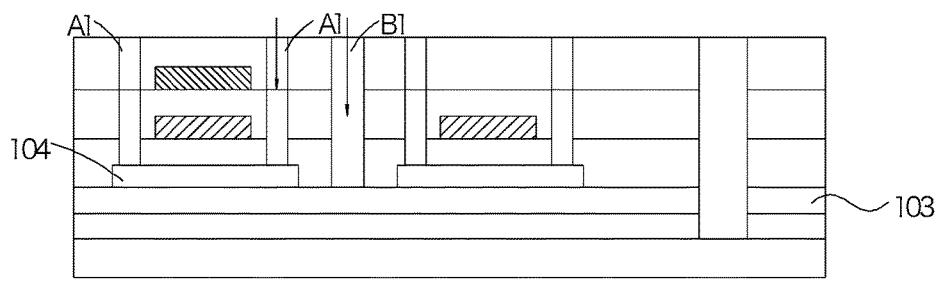
FIG. 3 is a schematic diagram of the status of the stacked structure in the step S13 shown in FIG. 1.

Specifically, the step of adopting a second etchant to perform a second etching process to the panel is as arrows shown in FIG. 3. Because the second etchant cannot etch a stacked structure of an inorganic material, but only etch the first etching stop pattern layer 110 made by a metal material such that the location of the hole to be etched B1 is not etched, and the location of the hole to be etched A1 continues to be etched until the first etching stop pattern layer is etched and removed. Because in the step S12, the second etching depth is deeper than the bottom of the first etching stop pattern layer 110 so that an etching depth of the hole to be etched B1 is deeper than an etching depth of the hole to be etched A1.

Wherein, when adopting a dry etching, the second etchant can include but not limited to a mixing gas of $SF_6$ and $O_2$, a mixing gas of $Cl_2$ and $O_2$, or a mixing gas of $Cl_2$ and $BF_3$. When adopting a wet etching, the second etchant can include but not limited to a liquid of $H_3PO_4$, a liquid of $HNO_3$, or a liquid of HCOOH.

Furthermore, in the present embodiment, in order to make the hole to be etched A1 to be contacted with the active layer 104, the hole to be etched B1 to be contacted with the buffering layer 103, the first etchant is repeatedly used until the hole to be etched A1 is contacted with the active layer 104, the hole to be etched B1 is contacted with the buffering layer 103. Besides, in the step S12, through controlling the etching time, a depth that is over than the bottom of the first etching stop pattern layer 110 is equal to a thickness of the active layer 104 so that when continuing to be etched, the hole to be etched A1 and the hole to be etched B1 can simultaneously and respectively contact with the active layer 104 and the buffering layer 103. At this time, the etching for the hole to be etched A1 and the hole to be etched B1 is finished.

Figure 4:
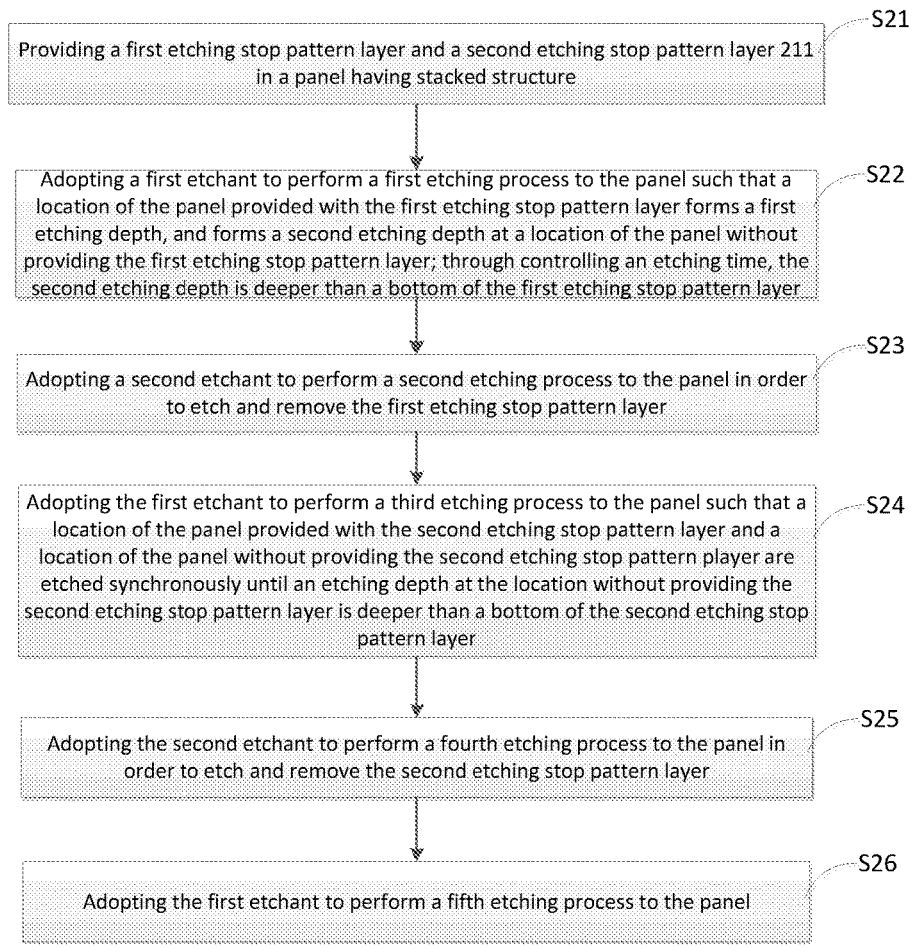
FIG. 4 is a flow chart of a control method for differentiated etching depth according to a second embodiment of the present invention.
Figure 5:
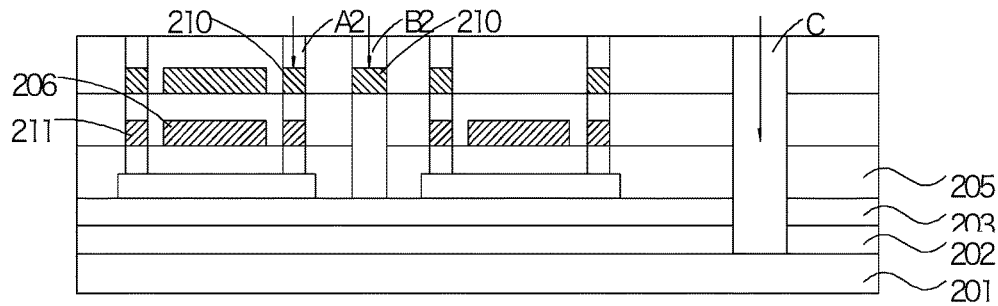
FIG. 5 is a schematic diagram of the status of the stacked structure in the step S22 shown in FIG. 4.

With reference to FIG. 4 and FIG. 5, the second embodiment of the control method for differentiated etching depth provided by the present invention includes:

S21: providing a first etching stop pattern layer 210 and a second etching stop pattern layer 211 in a panel having stacked structure.

Wherein, the second etching stop pattern layer 211 is located below the first etching stop pattern layer 210, and the number of the second etching stop pattern layer 211 is less than the number of the first etching stop pattern layer 210.

As shown in FIG. 5, in the present embodiment, holes to be etched in the stacked structure of a flexible display panel adopts a hole to be etched A2, a hole to be etched B2 and a hole to be etched C as an example. Wherein, the hole to be etched A2 and the hole to be etched B2 are the same as the hole to be etched A1 and the hole to be etched B1 of the first embodiment. The hole to be etched C is used for realizing a bending having a greater radius of curvature, requiring to be etched to the substrate 201.

Specifically, at the hole to be etched A2, providing a first etching stop pattern layer 210 and the second etching stop pattern layer 211, at the hole to be etched B2, providing the first etching stop pattern layer 210. The way to provide the first etching stop pattern layer 210 is the same as the first embodiment. When providing the second etching stop pattern layer 211, forming the second etching stop pattern layer 211 arranged at a same layer with a gate pattern layer 206 on the upper surface of a gate insulation layer 205. Besides, for simplifying the process, when forming the gate pattern layer 206, simultaneously adopting a same photolithography process to form the second etching stop pattern layer 211.

S22: adopting a first etchant to perform a first etching process to the panel such that a location of the panel provided with the first etching stop pattern layer 210 forms a first etching depth, and forms a second etching depth at a location of the panel without providing the first etching stop pattern layer 210. Through controlling an etching time, the second etching depth is deeper than a bottom of the first etching stop pattern layer 210.

Specifically, using a first etchant to perform a first etching process to the panel is as the arrows shown in FIG. 5. The hole to be etched A2 and the hole to be etched B2 stop etching because of the first etching stop pattern layer 210, and the hole to be etched C can continue to be etched, and being etched to be over than a bottom of the first etching stop pattern layer 210, the specific principle is the same as the step S12 in the first embodiment, no more repeating. In the present embodiment, at the hole to be etched C, a depth that is over than a bottom of the first etching stop pattern layer 210 in the step is equal to a sum of a thickness of the barrier layer 202 and a thickness of the buffering layer 203.

S23: adopting a second etchant to perform a second etching process to the panel in order to etch and remove the first etching stop pattern layer 210.

Figure 6:
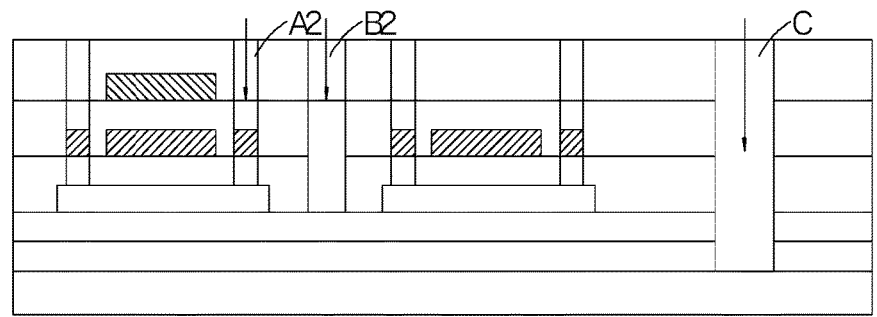
FIG. 6 is a schematic diagram of the status of the stacked structure in the step S23 shown in FIG. 4.

Specifically, the step of adopting a second etchant to perform a second etching process to the panel is as the arrows shown in FIG. 6. At the hole to be etched A2 and the hole to be etched B2, the first etching stop pattern layer 210 is etched and removed, and the hole to be etched C will not perform etching. The principle is the same as the step S13, no more repeating.

S24: adopting the first etchant to perform a third etching process to the panel such that a location of the panel provided with the second etching stop pattern layer 211 and a location of the panel without providing the second etching stop pattern player 211 are etched synchronously until an etching depth at the location without providing the second etching stop pattern layer 211 is deeper than a bottom of the second etching stop pattern layer 211.

Figure 7:
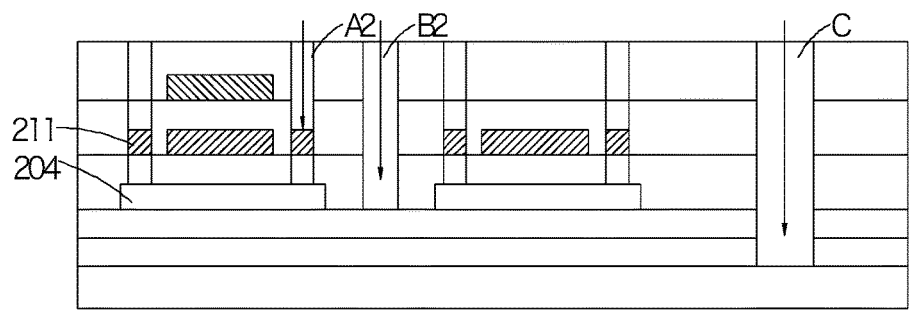
FIG. 7 is a schematic diagram of the status of the stacked structure in the step S24 shown in FIG. 4.

Specifically, when the first etching stop pattern layer 210 is etched and removed in the step S23, changing the etchant, continuing using the first etchant to perform etching to the panel. At this time, the hole to be etched A2, the hole to be etched B2 and the hole to be etched C are etched synchronously as the arrows shown in FIG. 7. When etching to a surface of the second etching stop layer, stop etching the hole to be etched A2, and the hole to be etched B2 and the hole to be etched C continue to be etched. Through controlling the etching time, an etching depth of the hole to be etched B2 is deeper than a bottom of the second etching stop pattern layer 211. Besides, in the present embodiment, a depth that is over than the bottom of the second etching stop pattern layer 211 at the hole to be etched B2 is equal to a thickness of the active layer 204.

S25: adopting the second etchant to perform a fourth etching process to the panel in order to etch and remove the second etching stop pattern layer 211.

Figure 8:
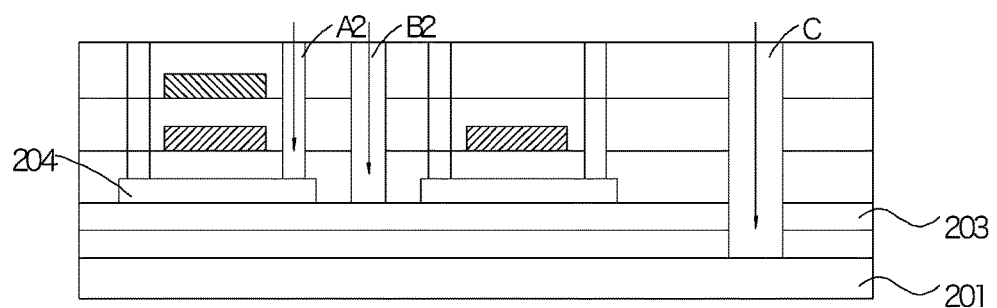
FIG. 8 is a schematic diagram of the status of the stacked structure in the step S25 shown in FIG. 4.

With reference to FIG. 8, changing the etchant, adopting the second etchant same as the step S23 to etch and remove the second etching stop pattern layer 211. At this time, the hole to be etched B2 and the hole to be etched C will not be etched, and at the three holes to be etched, remaining depths to be etched are the same.

S26: adopting the first etchant to perform a fifth etching process to the panel.

Changing the etchant, adopting the first etchant to etch the hole to be etched A2, the hole to be etched B2 and the hole to be etched C. Because the remaining depths to be etched of the three holes to be etched are the same, the hole to be etch A2 is contacted with the active layer 204, the hole to be etched B2 is contacted with the buffering layer 203, the hole to be etched C is contacted with the substrate 201 so that etching of the three holes is finished simultaneously so as to form three etching holes having different depths.

Comparing with the conventional art: the present invention through providing a first etching stop pattern layer in a panel having stacked structure; adopting a first etchant to perform a first etching process to the panel such that a location of the panel provided with the first etching stop pattern layer forms a first etching depth, and forms a second etching depth at a location of the panel without providing the first etching stop pattern layer; through controlling an etching time, the second etching depth is deeper than a bottom of the first etching stop pattern layer; and adopting a second etchant to perform a second etching process to the panel in order to etch and remove the first etching stop pattern layer, such that the location without providing the first etching stop pattern layer and the location providing with the first etching stop pattern layer form differentiated etching depth so that in a same mask process, through changing the etchant, different depths are etched and formed in order to reduce the time consuming of the process and decrease the production cost.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:
1. A control method for differentiated etching depth, comprising step of:
  providing a first etching stop pattern layer in a panel having stacked structure, and a second etching stop pattern layer in the panel having stacked structure, wherein, the second etching stop pattern layer is located below the first etching stop pattern layer;
  adopting a first etchant to perform a first etching process to the panel such that a location of the panel provided with the first etching stop pattern layer forms a first etching depth, and forms a second etching depth at a location of the panel without providing the first etching stop pattern layer; through controlling an etching time, the second etching depth is deeper than a bottom of the first etching stop pattern layer;
  adopting a second etchant to perform a second etching process to the panel in order to etch and remove the first etching stop pattern layer;
  adopting the first etchant to perform a third etching process to the panel such that a location of the panel provided with the second etching stop pattern layer and a location of the panel without providing the second etching stop pattern player are etched synchronously until an etching depth at the location without providing the second etching stop pattern layer is deeper than a bottom of the second etching stop pattern layer;

adopting the second etchant to perform a fourth etching process to the panel in order to etch and remove the second etching stop pattern layer;

adopting the first etchant to perform a fifth etching process to the panel;

wherein, from a bottom to a top, the stacked structure includes a substrate, a barrier layer, a buffering layer, an active layer, a gate insulation layer covering the active layer, a gate pattern layer, a capacitor dielectric pattern layer covering the gate pattern layer, a capacitor electrode pattern layer and an insulation layer covering the capacitor electrode pattern layer;

the first etching stop pattern layer and the capacitor electrode pattern layer adopt a same photolithography process to form and patterning simultaneously; and the second etching stop pattern layer and the gate pattern layer are disposed at a same layer and disposed on a surface of the gate insulation layer, and the second etching stop pattern layer and the gate pattern layer adopt a same photolithography process to form and patterning simultaneously.

2. The method according to claim 1, wherein, the step of adopting the first etchant to perform a fifth etching process to the panel comprises a step of:

adopting the first etchant to perform the fifth etching process to the panel such that a location of the panel provided with the first etching stop pattern layer and the second etching stop pattern layer is etched to the active layer; a location of the panel provided with the first etching stop pattern layer but without providing the second etching pattern layer is etched to the buffering layer.

3. The method according to claim 1, wherein, when adopting a wet etching method, the first etchant is HF or BOE, and the second etchant is $H_3PO_4$, $HNO_3$ or HCOOH.

4. A control method for differentiated etching depth, comprising step of:

providing a first etching stop pattern layer in a panel having stacked structure, and a second etching stop pattern layer in the panel having stacked structure, wherein, the second etching stop pattern layer is located below the first etching stop pattern layer;

adopting a first etchant to perform a first etching process to the panel such that a location of the panel provided with the first etching stop pattern layer forms a first etching depth, and forms a second etching depth at a location of the panel without providing the first etching stop pattern layer; through controlling an etching time, the second etching depth is deeper than a bottom of the first etching stop pattern layer; and adopting a second etchant to perform a second etching process to the panel in order to etch and remove the first etching stop pattern layer;

adopting the first etchant to perform a third etching process to the panel such that a location of the panel provided with the second etching stop pattern layer and a location of the panel without providing the second etching stop pattern player are etched synchronously until an etching depth at the location without providing the second etching stop pattern layer is deeper than a bottom of the second etching stop pattern layer; and adopting the second etchant to perform a fourth etching process to the panel in order to etch and remove the second etching stop pattern layer.

5. The method according to claim 4, wherein, when adopting a wet etching method, the first etchant is HF or BOE, and the second etchant is $H_3PO_4$, $HNO_3$ or HCOOH.

6. The method according to claim 4, wherein, after the step of adopting the second etchant to perform a fourth etching process to the panel in order to etch and remove the second etching stop pattern layer, the method further comprises a step of:

adopting the first etchant to perform a fifth etching process to the panel.

7. The method according to claim 6, wherein, the step of adopting the first etchant to perform a fifth etching process to the panel comprises a step of:

adopting the first etchant to perform the fifth etching process to the panel such that a location of the panel provided with the first etching stop pattern layer and the second etching stop pattern layer is etched to the active layer; a location of the panel provided with the first etching stop pattern layer but without providing the second etching pattern layer is etched to the buffering layer.

8. The method according to claim 6, wherein, from a bottom to a top, the stacked structure includes a substrate, a barrier layer, a buffering layer, an active layer, a gate insulation layer covering the active layer, a gate pattern layer, a capacitor dielectric pattern layer covering the gate pattern layer, a capacitor electrode pattern layer and an insulation layer covering the capacitor electrode pattern layer.

9. The method according to claim 8, wherein, the first etching stop pattern layer and the capacitor electrode pattern layer adopt a same photolithography process to form and patterning simultaneously.

10. The method according to claim 8, wherein, the second etching stop pattern layer and the gate pattern layer are disposed at a same layer and disposed on a surface of the gate insulation layer, and the second etching stop pattern layer and the gate pattern layer adopt a same photolithography process to form and patterning simultaneously.

* * * * *